United States Patent [19]
Pipe

[11] Patent Number: 5,327,088
[45] Date of Patent: Jul. 5, 1994

[54] MULTIPLEXED ECHO TRAINS IN NUCLEAR MAGNETIC RESONANCE

[75] Inventor: James G. Pipe, Ann Arbor, Mich.

[73] Assignee: The University of Michigan, Ann Arbor, Mich.

[21] Appl. No.: 924,645

[22] Filed: Jul. 31, 1992

[51] Int. Cl.$^5$ ............................................. G01V 3/00
[52] U.S. Cl. ................................... 324/309; 324/307
[58] Field of Search ............... 324/309, 307, 300, 306, 324/313

[56] References Cited

U.S. PATENT DOCUMENTS

| | | | |
|---|---|---|---|
| 4,719,425 | 1/1988 | Ettinger | 324/316 |
| 4,803,432 | 2/1989 | Perman | 324/309 |
| 4,982,161 | 1/1991 | Twieg | 324/309 |
| 5,126,673 | 6/1992 | Hennig | 324/309 |
| 5,204,626 | 4/1993 | Onodera et al. | 324/309 |

OTHER PUBLICATIONS

Paul J. Keller, Ph.D., "Basic Principles of Magnetic Resonance Imaging", St. Joseph's Hosptial, Phoenix, Ariz., Jun. 1988, pp. 5–29.

Michael K. Stehling, et al., "Echo-Planar Imaging: Magnetic Resonance Imaging in an Fraction of a Second", *Science* Oct. 4, 1991, pp. 43–50.

Patrick Le Rouz, et al., "Burst Excitation Pulses", *Proc. SMRM.*, 1991, p. 269.

J. Hennig, et al., "Fast Imaging Using Burst Excitation Pulses", *Proc. SMRM* 1988, p. 238.

*Primary Examiner*—Louis Arana
*Attorney, Agent, or Firm*—Harness, Dickey & Pierce

[57] ABSTRACT

A nuclear magnetic resonance (NMR) technique for producing multiplexed NMR echo trains. The present invention results in the placement of discrete copies of the original spin-echo in a line along k-space. Utilizing a conventional NMR apparatus, a longitudinal magnetic field is first generated. Next a train of NMR spin-echoes is created by imprinting a repetitive pattern on the longitudinal magnetization. This pattern is composed of a sum of complex exponentials. The spins are then evolved and observed in an uninterrupted readout period. The result is an NMR pulse sequence (10) which splits the spin-echo into a series of spin-echoes thereby permitting the sampling of k-space in a single data acquisition. In the preferred embodiment, the multiplexed echo train technique of the present invention is applied to single-shot magnetic residence imaging (MRI) to permit rapid collection of data, fast screening, and two or three-dimensional imaging in clinically practical times.

47 Claims, 9 Drawing Sheets

PULE SEQUENCE DIAGRAM OF A CONVENTIONAL SPIN ECHO SEQUENCE

PULSE SEQUENCE DIAGRAM OF A TYPICAL ECHO PLANAR SEQUENCE

A) SPIN ECHO WITHOUT APPLICATION OF MULTIPLEXING SCHEME

B) SPIN ECHO AFTER APPLICATION OF MULTIPLEXING SCHEME

C) SPECTRAL PROFILE OF ECHO WITHOUT MULTIPLEXING

D) SPECTRAL PROFILE OF ECHO WITH MULTIPLEXING b) EPI a)Spin Echo c) MET

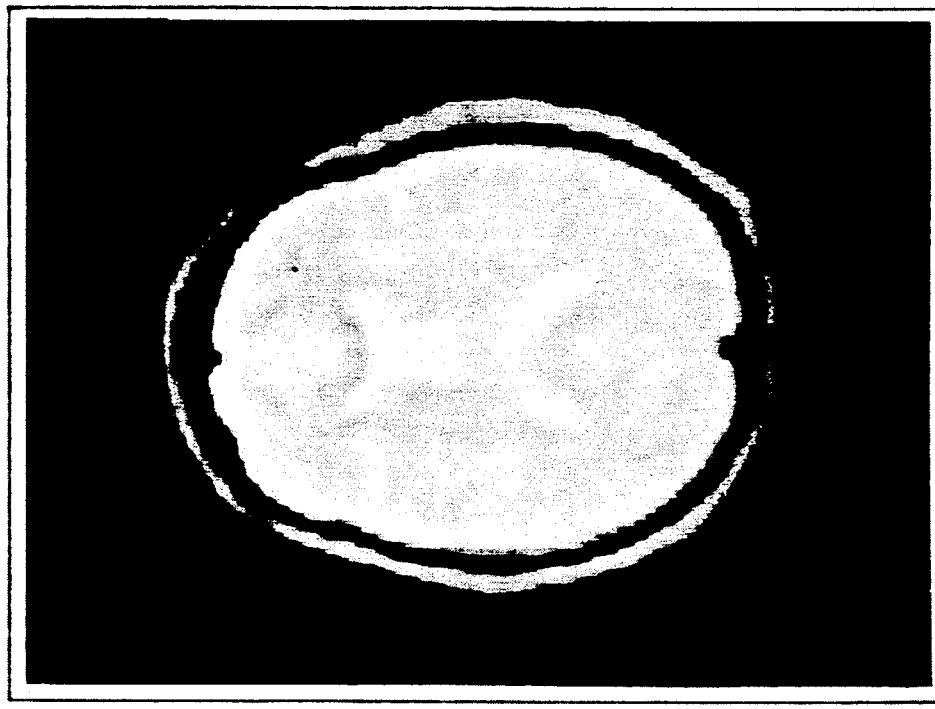
Fig-17A  *a) Spin Echo*
PRIOR ART
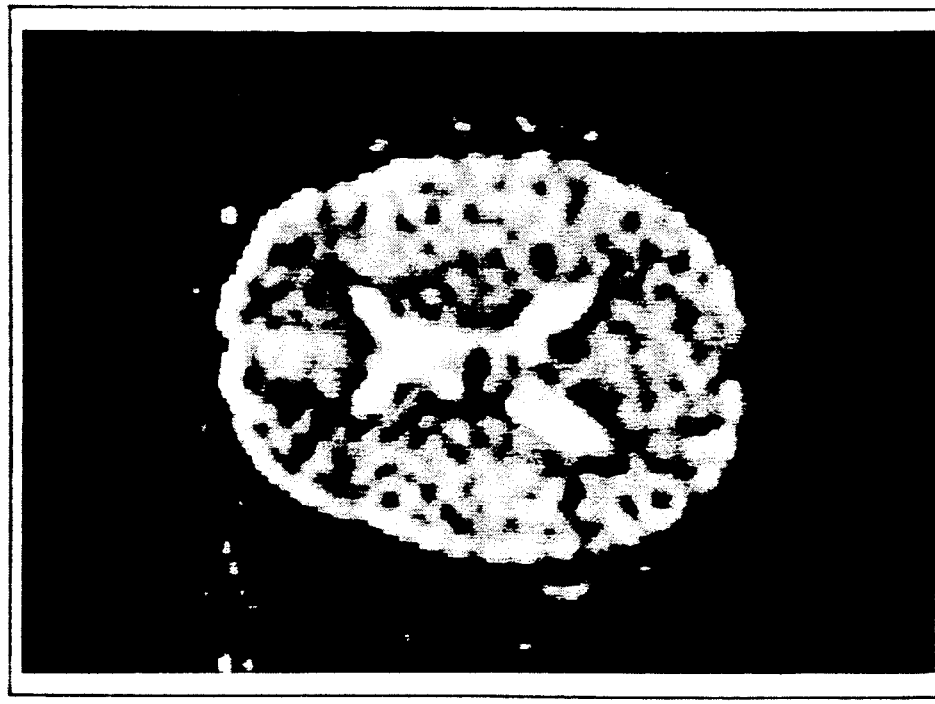
Fig-17B  *b) MET*

MULTIPLEXED ECHO TRAINS IN NUCLEAR MAGNETIC RESONANCE

FIELD OF THE INVENTION

This invention relates to nuclear magnetic resonance (NMR) and in particular to techniques for producing multiplexed NMR echo trains.

BACKGROUND TO THE INVENTION

Nuclear magnetic resonance NMR is an important measuring technique with many applications. NMR is based on the precessional properties of tiny magnetic moments of atomic nuclei. In an external magnetic field these nuclei can assume a low-energy state when aligned with the field, or a higher-energy state when aligned against the field. A weak but rapidly alternating magnetic field of appropriate frequency applied by a coil near a specimen will stimulate changes in the orientation of the nuclear magnetic moment relative to the direction of the strong static magnetic field. This results in absorption of energy which is emitted when the nucleus returns to the equilibrium state. The absorption and emission of energy take place at the resonant frequency which is a function of the nuclear species and the static magnetic field strength. A detector picks up the timing and type of the emitted energy from which the chemical makeup of the specimen can be discerned.

Spatial information in NMR data can be obtained by imposing a slight gradient in the static magnetic field. Because the resonance frequency of the signal from the nuclei is proportional to the field, it is possible to derive the position of the nuclei by imposing gradients in different directions and detecting the different frequencies of NMR signals.

An important application of NMR is magnetic resonance imaging (MRI) which is a biomedical technique for depicting tissues within the body. In most MRI medical applications proton NMR signals are used to make anatomical images of biological structures. Three-dimensional reconstruction of images can be achieved using gradients by employing algorithms similar to those in computed X-ray tomography. However, MRI has a number of advantages; it generally provides more contrast between tissues than computed X-ray tomography, and it does this without exposing a patient to any X radiation.

However, conventional MRI also has a number of drawbacks, which include a relatively long data acquisition time (on the order of a minute). As a result, MRI images are subject to motional artifact caused by physiological motions such as heartbeat, blood flow and breathing or voluntary movements of patients. Acquisition time in conventional MRI is long because it requires repeated data acquisitions to acquire an image. In MRI magnetic field gradients allows one to induce spatially and linearly varying frequencies of the NMR signal along the "readout" direction. This produces a spatial spectrum whose Fourier transform is expressed in a time-varying MRI signal. In conventional MRI this signal is seen as an echo whose peak corresponds to the occurrence of coherent phase of the spins along the readout direction. In order to obtain a two-dimensional image, one typically repeats the data acquisition many times to obtain echoes which are identical except for a change in coherence along the "phase encoded" direction. While the actual number and timing of these acquisitions vary greatly, an average image would require 128 data acquisitions each taken $\frac{1}{2}$ second apart, requiring 1 minute for total data collection time.

One improvement on conventional MRI is known as fast imaging. In fast imaging techniques the delay between acquisitions is shortened significantly so that the multiple data acquisitions can be obtained in one to ten seconds. Example of fast imaging are two techniques known as GRASS and FLASH.

Another improvement in conventional MRI is known as single-shot imaging. Rather than repeat the data acquisition many times, single-shot techniques allow one to obtain similar copies of an echo in rapid succession in one data collection by the repeated, periodic reversal of the sign of the readout field gradient. This gradient reversal continually "unwraps" the phase changes previously induced, and thus gives repeated coherent echoes. This technique, generally known as Echo-Planar Imaging (EPI) permits the collection of an entire two dimensional data set in a single experiment. This allows rapid collection of data for time-evolution studies and fast screening as well as greatly decreasing motion artifact in the "phase encoded" direction.

The difference between EPI and conventional spin-echo imaging is often illustrated by describing the path traversal in k-space, which is the Fourier representation of physical space as expressed by spatially dependent NMR frequencies. In order to obtain an image, one must sample a two-dimensional k-space "completely." In practice, discrete finite data sampling forces one to limit spatial resolution and spatial boundaries. For further discussion of EPI, see Mansfield, P., J. Phys. C. 10, L55 (1977).

Referring now to FIG. 1, a k trajectory of a conventional spin-echo sequence is shown where one line of k-space is sampled at a time. A typical EPI technique is shown in FIG. 4. Here, the data acquisition covers k-space in one data acquisition. The rapid reversal of the readout gradient is expressed in the reversal of the trajectory along $k_x$ (the x-axis of k-space). If one removes the phase encoding gradients from an EPI experiment, one obtains an echo for each pass through the origin of k space. In FIG. 1 and 4 arrows indicate the direction of the trajectory as determined by the sign of the field gradients during readout. In EPI the addition of small amounts of a magnetic field gradient in an orthogonal direction cause each gradient echo to have the spatial information encoded for this second direction. It will be appreciated that, in both conventional MRI and EPI, the two-dimensional data matrix in FIGS. 1 and 4 is the two-dimensional Fourier transform of the spatial distribution of the detected signal. This matrix can then be transformed to obtain the desired image.

In EPI the image can be generated in much less time than in conventional MRI, e.g., data acquisition periods may be approximately 32-100 milliseconds. Unfortunately, EPI also has a number of disadvantages. It requires specialized hardware which is implemented on only a small percentage of clinical MRI systems. This is because inherent in EPI is the rapid oscillatory switching of a magnetic field gradient between positive and negative values to produce a train of gradient echoes of the MR signal which are detected and parsed into the two-dimensional k-space matrix. This change in readout field gradient over time ("slew rate") is limited by the quality of the hardware which produces the necessary field gradients. Also, the fact that each echo in an EPI data set is a gradient recalled echo rather than a spin echo leads to enhanced artifacts from chemical shift and poor field inhomogeneity.

Thus, it would be desirable to provide an NMR technique which can generate multiple spin echoes in a single data acquisition. It would also be desirable to provide an NMR technique which can be used to produce MRI images in less time than conventional MRI techniques. To this end it would be desirable to provide such a technique which can provide single-shot MRI imaging, thereby decreasing motion artifact in the "phase encoded" direction which often results from multiple data acquisitions. It would also be desirable to provide a single-shot MRI technique which avoids the constant reversal of the readout gradient to permit single-shot MRI imaging in conventional clinical MRI equipment. Further, it would be desirable to provide such a system which avoids chemical shift artifacts as well as artifacts due to magnetic field inhomogeneity which can degrade the MRI images. In addition, it would be desirable to provide these features in a system which permits the utilization of conventional MRI equipment without significant reconfiguration or added cost to the apparatus.

SUMMARY OF THE INVENTION

Pursuant to the present invention a technique is provided which is capable of producing a plurality of NMR echoes without the constant reversal of the readout gradient. Prior to readout, the present invention results in the placement of discrete copies of the original spin-echo in a line along k-space. Each of these echoes can be thought of as the original echo convolved with a delta function at some discrete spatial frequency.

In accordance with one aspect of the present invention there is provided a method for generating an NMR signal from an object, by first providing an NMR apparatus including a means for producing longitudinal magnetic field. The next step in order to generate a train of NMR spin-echoes is to prepare the spins of the nuclei by imprinting a repetitive pattern on the longitudinal magnetization of the NMR apparatus. This pattern is a function f(x) composed of a series of delta functions which is equivalent to spatially multiplying the magnetization by a series of complex exponentials in x. Next, an ordinary spin echo is convolved with the function f(x) and the resulting modified spin system is precessed in an evolutionary stage to produce a sequential train of echoes which are observed in an uninterrupted readout period.

In accordance with a preferred embodiment of the present invention, the step of imprinting includes the step of applying a plurality of radio frequency (rf) pulses with different amplitudes and different durations, wherein each rf pulse is separated by a different period of spin precession, whereby the longitudinal magnetization is effectively multiplied by a function composed of the sum of weighted cosine functions.

This results in an NMR technique which splits the spin echo into a series of echoes, thereby permitting the sampling of k-space in a single data acquisition. One application of this technique is in single-shot MRI imaging to permit rapid collection of data, fast screening and two or three-dimensional imaging in clinically practical times.

BRIEF DESCRIPTION OF THE DRAWINGS

The various advantages of the present invention will become apparent to one skilled in the art by reading the following specification and by reference to the following drawings in which:

FIGS. 17A-B are in vivo images of the axial plane through the head of a human subject for a conventional spin echo sequence and for a multiplexed echo train imaging sequence in accordance with the present invention.

DESCRIPTION OF THE PREFERRED EMBODIMENTS

The present invention comprises a system and technique for multiplexing information obtained by nuclear magnetic resonance (NMR). This multiplexing is implemented via multiplication of frequency information by a function (f) composed of a series of complex exponentials. Because of the Fourier relationship between frequency and time, the Fourier transform of the inherent frequency profile is convolved with the Fourier transform of the function f in the time domain, the latter being a series of delta functions. The net effect of this convolution is the production of a train of echoes of the NMR signal which occurred during the observation period of an NMR pulse sequence. This train of echoes can be exploited to obtain two dimensions of information (inter-echo and intra-echo) in a single observation period. This technique will be referred to as multiplexed echo trains (MET).

The preferred embodiment of the present invention involves the application of the MET technique to single-shot magnetic resonance imaging. However, it will be appreciated that there are other ways of applying MET to MRI, and there are other non-MRI applications of MET, which may be employed, as discussed in more detail below.

A general introduction to MRI may be found in Paul J. Keller, "Basic Principles of Magnetic Resonance Imaging," published by St. Joseph's Hospital and Medical Center of Phoenix, Ariz., pp 1-29, 1988, which is hereby incorporated by reference.

In MRI, the use of magnetic field gradients allows the introduction of spatially and linearly varying frequencies of the NMR signal along the "readout" direction. This produces a spatial spectrum whose Fourier transform is expressed in the time-varying NMR signal. In a conventional MRI experiment, this signal is seen as an echo whose peak corresponds to the event that the spins have coherent phase along the readout direction. In order to obtain a two-dimensional image, one typically repeats this experiment many times to obtain echoes which are identical except for a change in coherence along the "phase encoded" direction.

Figure 1:
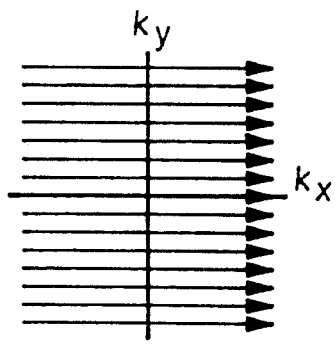
FIG. 1 is a diagram of a two-dimensional Fourier representation of an MRI image space as sampled in conventional MRI.
Figure 2:
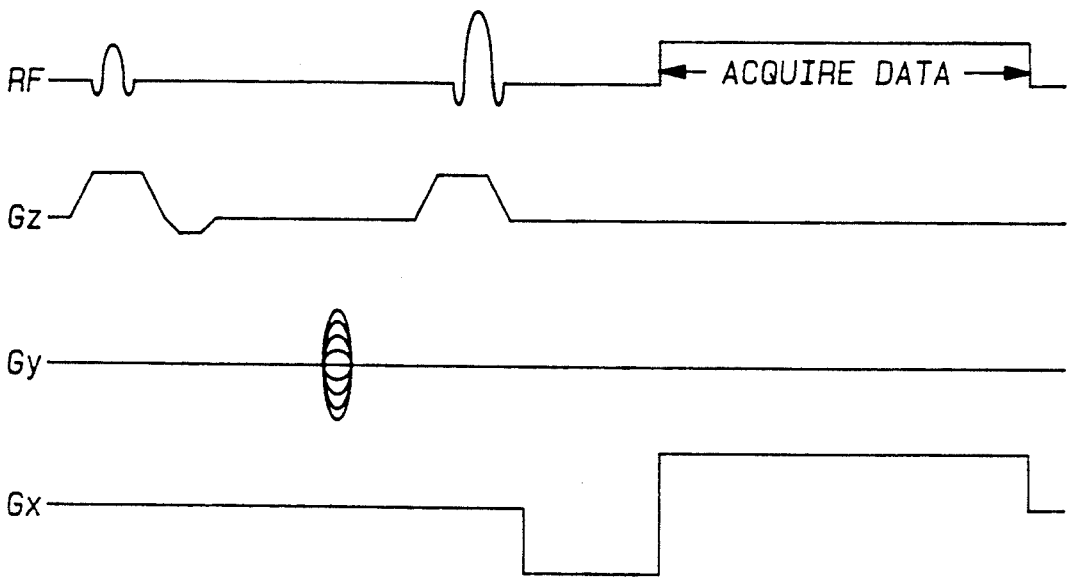
FIG. 2 is a diagram of a conventional MRI magnetization and pulse sequence.

FIG. 1 shows a typical k-space trajectory for a conventional MRI spin echo sequence. The term "k-space" refers to a two-dimensional Fourier representation of physical space as expressed by spatially dependent NMR frequencies, which can be transformed to obtain a desired image. It will be appreciated that to obtain an image, one must sample the two-dimensional k-space "completely". In conventional imaging techniques this is done by sampling one line k-space at a time. During each acquisition the echoes produced are identical except for a change in coherence along the "phase encoded" direction. A diagram of the phase sequences which are typically used to perform conventional MRI is shown in FIG. 2, where the phase encoded gradients which change for each data acquisition are shown along the $G_Y$ line. The slice selective gradient is $G_z$, the gradient along the readout direction is $G_x$ and RF is the excitation rf pulse. The main drawback with this conventional MRI approach is the long data acquisition time, which may be on the order of several minutes.

Figure 3:
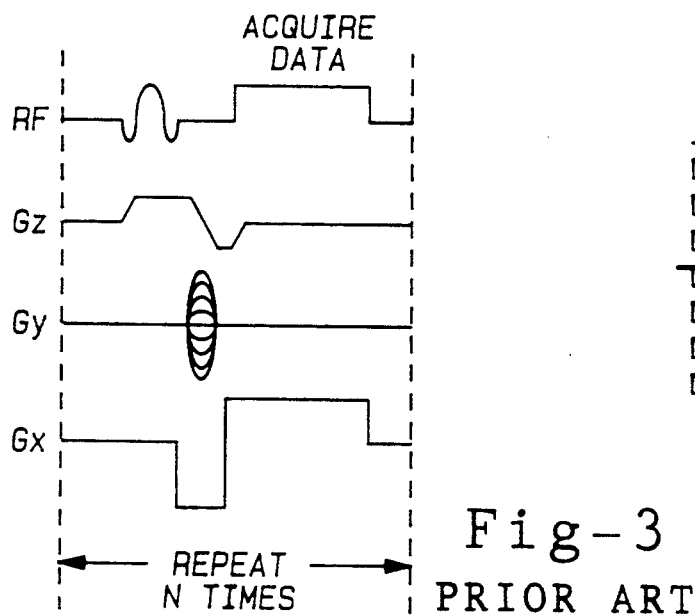
FIG. 3 is a diagram of a typical fast scan MRI magnetization and pulse sequence.

One improvement is know as "fast scan" MRI, which samples k-space in the same way shown in FIG. 1, but in a speeded up process. This approach utilizes a configuration such as that shown in FIG. 3. For further details for the fast scan approaches, see the above-cited Keller reference at p 24. These techniques can reduce the data acquisition down to a range of 1 to 3 seconds.

A third approach is known as echo planer imaging (EPI), which is a single-shot technique, thereby permitting the collection of an entire two-dimensional set in a single experiment. In EPI instead of repeating the data acquisition many times, one may obtain similar copies of an echo in rapid succession in one experiment (one data collection) by the repeated, periodic reversal of the sign of the readout field gradient. This gradient reversal continually "unwraps" the phase changes previously induced, and thus gives repeated coherent echoes. For further discussion of EPI see Mansfield, P., J. Phys. C., 10, L55 (1977).

Figure 4:
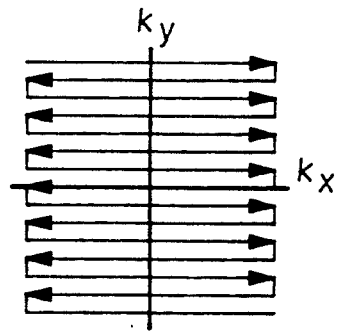
FIG. 4 is a diagram of a two-dimensional Fourier representation of an MRI image space as sampled with an echo planar technique.

FIG. 4 is a diagram of a typical k-space trajectory in EPI where the arrows indicate the direction of the trajectory as determined by the sign of field gradients during readout. The rapid reversal of the readout gradient is expressed in the reversal of the trajectory along $k_x$. EPI enables the collection of an entire two-dimensional data set in a single experiment, allowing rapid collection of data for time-evolution studies and fast screening as well as greatly decreasing motion artifact in the "phase encoded" direction. However, the change in the readout field gradient over time (slew rate) is limited by the quality of the hardware which produces field gradients, and is a primary technical limitation on clinical implementation of EPI, as discussed above.

Figure 5:
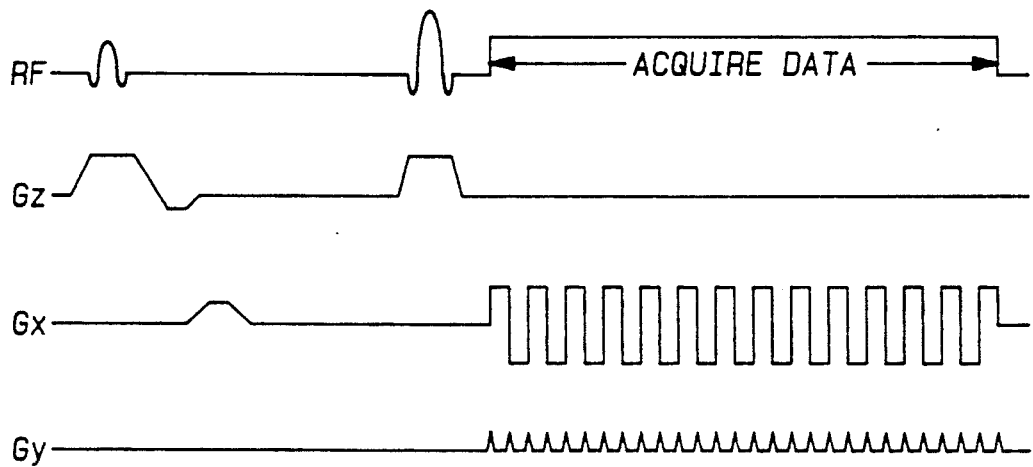
FIG. 5 is a diagram of an echo planar MRI magnetization and pulse sequence.

FIG. 5 is a diagram of the data acquisition scheme for EPI. The repeated reversal of the readout gradient is shown in the line labeled $G_x$. In sum, EPI yields a single-shot MRI imaging technique that can acquire data in approximately 0.1 seconds.

Due to above discussed drawbacks with EPI it would be advantageous to produce the train of echoes obtained in EPI without the constant reversal of the readout gradient. Unfortunately, with a constant readout gradient, one continues at a constant rate through k-space and can only pass through the origin of k-space once.

Figure 6:
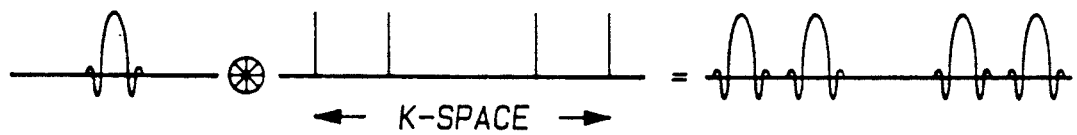
FIG. 6 is a diagram of the convolution of an echo with a series of delta functions producing a series of adjacent echoes in k-space in accordance with the present invention.

In accordance with the present invention, prior to readout, it is possible to place discrete copies of the original spin-echo (centered at the origin) in a line along k-space. Each of these echoes can be thought of as the original echo convolved with a delta function at some discrete spatial frequency. This process is depicted in FIG. 6. Convolution of an ordinary spin-echo with a function f(x) composed of a series of such delta functions along $k_x$ is equivalent to spatially multiplying the magnetization by a series of complex exponentials in x. The precession of this modified spin system (seen as the linear progression through k-space) during observation will produce a sequential "train" of echoes. The production of this sequential train of echoes is one of the core ideas behind multiplexed echo trains.

It should be noted that the spectrum that is modulated need not be a spatially dependant one created by the addition of field gradients. The above approach can be applied to spectra created by field inhomogeneity, chemical shift, etc, since it relies only on the fundamental multiplication-convolution duality of Fourier pairs. In this context one speaks of exponential in frequency $\omega$ with delta functions in time t. For now the discussion will focus on the spatial coordinates and will later return to the effects of other spectral coordinates.

To implement multiplexed echo trains, a method for multiplying the spectrum by the function f is required. While there is an infinite set of functions one might choose, the preferred embodiment will be limited to that set of f composed of 2N delta functions which are even symmetric in $K_x$ space. One can then represent f(x) as:

$$f = \sum_{i=1}^{N} a_i \cos(b_i x), \qquad [1]$$

where the constants $a_i$ are scaling factors and the constants $b_i$ represent the position of the i'th pair of delta functions from the zero-frequency point in k-space. It can be shown (See appendix I) that if one interleaves a series of radio frequency (rf) pulses with the application of a field gradient along the X direction, the longitudinal magnetization will be multiplied by the function f of equation 1, given that the phase of each rf pulse is the same and the rf is applied "on resonance".

Figure 7:
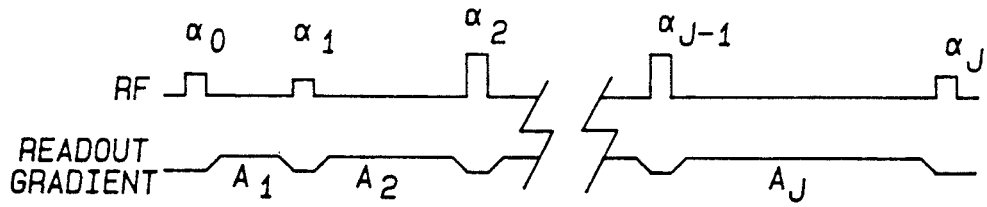
FIG. 7 is an example of a spin preparation sequence used to create multiplexed echo trains along the direction of the readout gradient in accordance with the present invention.
Figure 8:
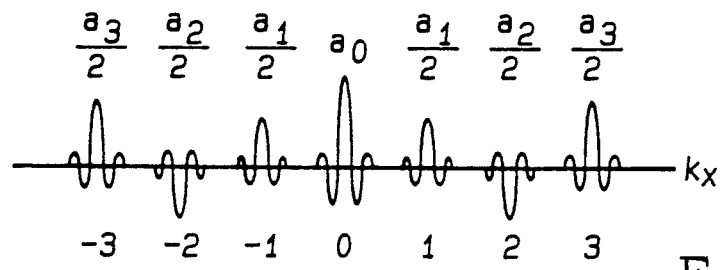
FIG. 8 is a generic representation of a multiplexed 7-echo train formed via the pulse sequence of FIG. 7.

FIG. 7 is a genetic example of spin-preparation sequence used to create multiplexed echo trains along the direction of the readout gradient. If the time integral of the j'th gradient pulse is $A_j$, then every possible coefficient $b_i$ of [1] given by $$b_i = \sum_{j=1}^{J} d_{ij} A_j, \qquad [2]$$

where:

$d_{ij} \in \{-1, 0, 1\}.$ (See appendix 1)

There are $3^J$ possible values for $b_i$. Every different combination of $d_{ij}$ gives a new value of $b_i$, but every value of $b_i$ is not guaranteed to be unique. For instance, consider the application of two gradient pulses (J=2) between three rf pulses. There are $3^2=9$ possibilities $b_i$. If $A_1=1$, and $A_2=2$, then these 9 possibilities are:

| $d_{i1}$ | $d_{i2}$ | | $b_i$ |
|---|---|---|---|
| −1 | −1 | −1(1) + −1(2) = | −3 |
| −1 | 0 | −1(1) + 0(2) = | −1 |
| −1 | 1 | −1(1) + 1(2) = | 1 |
| 0 | −1 | 0(1) + −1(2) = | −2 |
| 0 | 0 | 0(1) + 0(2) = | 0 |
| 0 | 1 | 0(1) + 1(2) = | 2 |
| 1 | −1 | 1(1) + −1(2) = | −1 |
| 1 | 0 | 1(1) + 0(2) = | 1 |
| 1 | 1 | 1(1) + 1(2) = | 3 |

Note that there is redundancy in some of the values of $b_i$. In addition, $-b_i$ values are redundant with $+b_i$ values since the sign of the cosine argument in equation 1 is of no significance. Hence, for this example, there are four possible values for $b_i$: 0,1,2 and 3. The non-zero values for $b_i$ will correspond to a pair of exponentials located at $\pm b_i$. Therefore, the sequence in FIG. 7 will produce 7 echoes, as illustrated in 8.

In general, if evenly spaced echoes are desired, with the spacing between adjacent echoes in k-space equal to S, then the areas under all of the gradient applications should be integer multiples of S. Given this condition, the echo peaks during readout will occur only where the total area under the readout gradient is an integer multiple of S. While one chooses the number of rf-gradient pairs and the size of each gradient to determine echo placement; rf strengths will primarily determine the relative strength of the a's of Equation 1. The exact values of the $a_i$'s as a function of rf strength are simple to calculate, either analytically or numerically; if J is large, however, the analytical expression for $a_i$ is quite lengthy. One can use a variety of optimization schemes for desired $a_i$ strengths to choose appropriate rf strengths. Often an equal weighting of echoes may be desired; however, one may distribute the signal such that (for instance) there is a larger fraction of the available power in either the lower or higher frequency data by appropriate choice of multiplexing rf strengths.

Signals to Noise Ratios (SNR) of resulting MR data are a direct result of the relative heights of the aj's. Since rotations of the magnetization via both rf and field gradients preserve the power of the NMR signal, it is easy to show that $$a_0^2 + \left[ 2 \sum_{i=1}^{N} \left( \frac{a_j}{2} \right)^2 \right] \leq 1, \qquad [3]$$

where $a_0$ is the coefficient of the Cosine (0) term, and the 2's in the rest of the equation arise from the expansion of the cosine into exponential at $\pm b_i$. In effect, equation 3 states that the power of a single echo is redistributed to many separate echoes. This is important, since it shows that there is an upper limit on the total power of the multiplexed echoes. The inequality arises from the fact that the method illustrated in FIG. 7 for obtaining multiplexed echoes multiples only the longitudinal magnetization $M_z$ with the function f(x) of equation 1, and there is likely to be power in the transverse magnetization. In the applications discussed below, the signal in the transverse plane is eliminated via gradient spoiling; thus there is actually a net loss of power. Therefore, when one chooses rf pulse strengths, one must optimize the $a_i$'s not only according to some criterion which determines the relative strengths, but also in order to maximize the power maintained along $M_z$ (i.e. minimize the signal in the transverse plane after the spin preparation scheme).

Multiplexed Echo Trains for Spatially Independent Spectra

Figure 9:
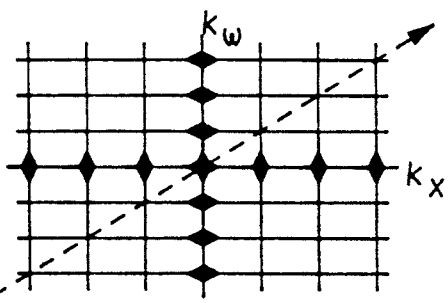
FIG. 9 is an example of multiplexed 7-echo train configured so that i'th gradient echo in $k_x$ corresponds with the i'th chemical shift/field inhomogeneity echo in $k_\omega$ along the readout trajectory.

The above discussion has considered how one can create a multiplexed echo train in the spatial frequency domain, as defined by the presence of a spatially linear magnetic field gradient imposed on a homogeneous system of spins. This is done by letting the individual spins precess under the influence of the field gradient for fixed amounts between rf pulses. Consider now the addition of an additional frequency dependence which is independent of the applied field gradients; two causes of this are chemical shift and an inhomogeneous main magnetic field. This will then add a precession between rf pulses which cannot be controlled by varying gradient pulses. It is shown in Appendix I that this spectral precession can be modelled exactly the same as the spatial spectra imposed by the field gradient. For these spectra, the timing between the rf pulses of FIG. 7 is analogous to the time integral of the field gradient strength; both impose a fixed amount of precession that can be varied quantitatively with respect to the rest of the pulse sequence. Thus the timing between rf pulses will determine the position of echoes (i.e. determine the value of $b_i$ of equation 1) in a $k\omega$-space which is the Fourier representation of the spatially independent spectra. Consider the case where one wants the echoes due to field gradient refocussing to coincide with the echoes due to refocussing of chemical shift and field inhomogeneity, thereby eliminating spatial distortion in the phase-encoded direction due to these phenomena. One must program each gradient strength during the spin preparation of FIG. 7 so that its time-integrated area $A_j$ is equal to the product of the readout gradient strength and the time between the adjacent rf pulses $a_{j-1}$ and $a_j$. This condition would be satisfied if the readout gradient were constant during the entire sequence. One cannot leave this gradient on all the time, however, due to the limited bandwidth of the rf pulses. If this condition is satisfied, the echoes will be replicated in k-space as in FIG. 9, where the k-space trajectory during readout is shown by the dashed line. That is, FIG. 9 shows an example of a multiplexed 7-echo train designed so that the i'th gradient echo in $k_x$ corresponds with the i'th chemical shift/field inhomogeneity echo in $k_\omega$ along the readout trajectory. Echoes are shown as diamond hashes, and lines are extended to show interactions.

Application of Multiplexed Echo Trains to Single-Shot Imaging

Figure 10:
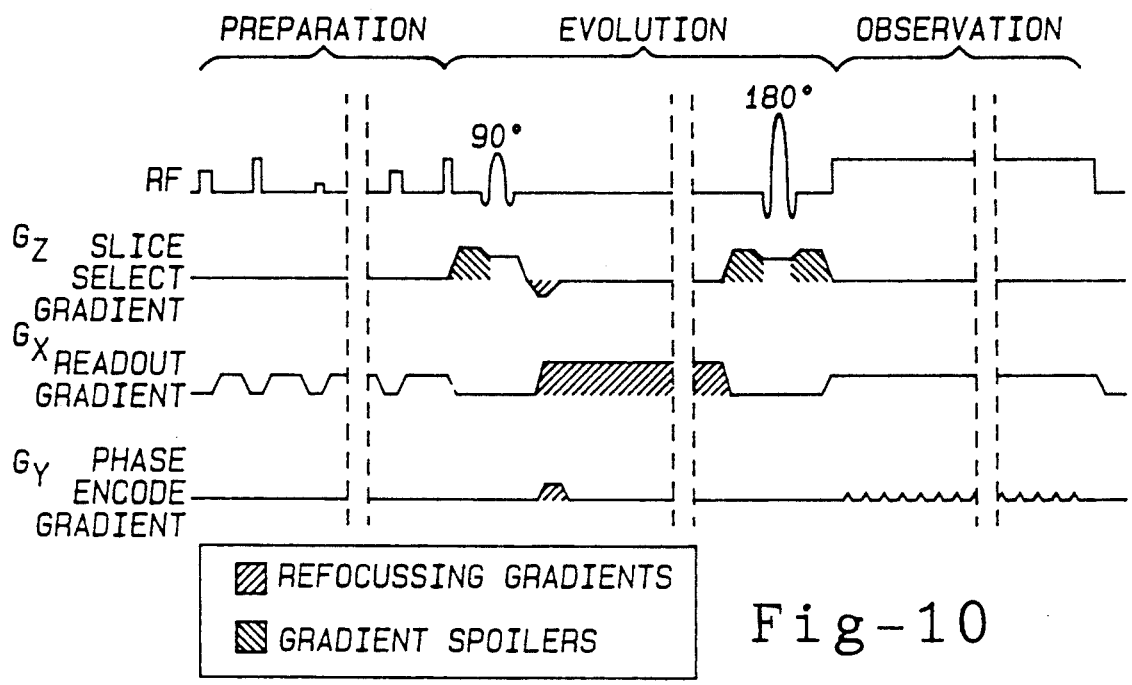
FIG. 10 is an example of a typical magnetization and pulse sequence for single-shot imaging using multiplexed echo trains in accordance with the present invention.

The aim of the preferred embodiment is to develop a train of echoes under a constant readout gradient to obtain all the data for a single image in one data collection, in the fashion of EPI. The foregoing discussion has disclosed how to create a train of echoes during readout and how to correct for other spectral components not related to applied field gradients. The multiplexing scheme shown in FIG. 7 stores all information along the longitudinal magnetization $M_z$. FIG. 10 shows a simple sequence 10 designed to detect the magnetization along $M_z$ and phase encode the echoes in the direction orthogonal to readout in accordance with a preferred embodiment of the MET technique of the present invention. The spin preparation section of the sequence corresponds to that of FIG. 7. After preparation, the echo train is inherent in the longitudinal magnetization, and is centered at the zero-frequency point in k-space. After the 90 degree pulse rotates the longitudinal magnetization into the transverse plane, an evolution period (including appropriate gradients) lets one transverse k-space to one of the echo train. A 180 degree pulse then reverses the trajectory through k-space, and during readout each echo is seen sequentially. A small amount of "phase encoded" field gradient is added orthogonal to the readout direction between each echo in order to sample each echo with a slightly different phase coherence in that direction for complete k-space sampling.

Figure 11:
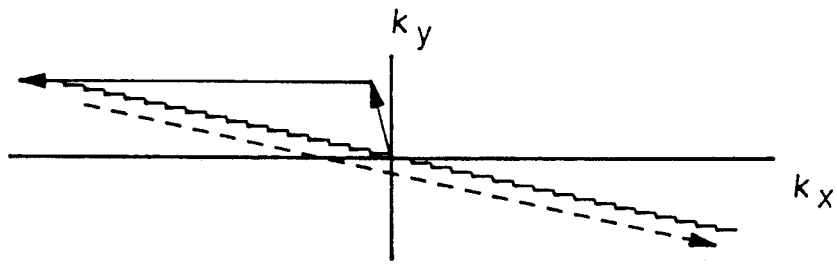
FIG. 11 illustrates the trajectory through k-space taken during the evolution and observation periods of the pulse sequence shown in FIG. 10.

The k-space trajectory during evolution and observation of the pulse sequence in FIG. 10 is illustrated in FIG. 11. The thin line shows the entire trajectory. The dashed line with arrowhead indicates the general direction taken during observation. After all the data is collected, each echo can be inserted into a separate row of a two-dimensional imaging matrix. Note that each echo will be inherently weighted by the constant $a_i$. This weighting must be normalized out before a standard two-dimensional Fourier Transform can be applied to the data matrix, or severe ghosting in the phase-encoded direction will occur. The normalization can be done with calculated values or with values measured from a multiplexed echo train experiment with no phase-encoded gradient on. The former (calculated) normalization factors will be free from electronic noise and other artifact, while the latter (measured) normalization will take into account relaxation effects during observation.

Figure 12:
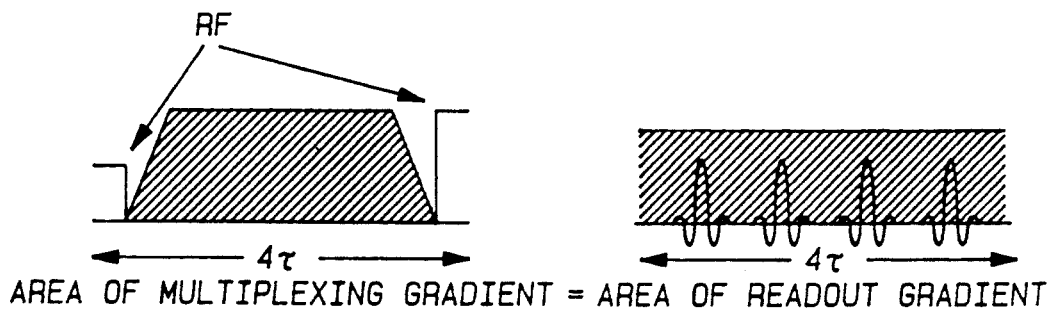
FIG. 12 is an illustration of the demand on multiplexing gradients given the desired time integral area and limited time available.

Those skilled in the art will appreciate that FIG. 10 demonstrates that the hardware requirements are very small during the observation part of the sequence, which is the part of EPI sequences that demand the most from the readout gradient. The most rigorous demand on gradients for imaging purposes in the present invention occur in the preparation part of the sequence. There are two basic requirements on the gradients which are the most demanding. The first is that the time integrated area $A_j$ of each of the multiplexing gradients be integer multiples of some common area (an appropriate common area is the product of the readout gradient and the time between adjacent echo peaks during readout, earlier referred to as S). This not only will center each echo in the two-dimensional k-space matrix; more importantly, it is needed for the case in which the multiplexed echoes are overlapping due to redundant $b_i$'s of Equation 2. If the areas $A_j$ are slightly off, there is undesired interference between overlapping echoes which cannot be removed via postprocessing of the data. Simple amplitude adjustments for each of these gradient strengths may therefore be needed to compensate for system imperfections. The second demand on the gradients also occurs during preparation. If complete chemical shift and inhomogeneity correction is required, then the time between each pair of adjacent rf pulses is fixed. If that time is equal to, say, 4 times the interval between echo peaks during readout (call this $4\tau$), then the area of the multiplexing gradient must be 4 times the product of the readout gradient and $4\tau$ in a time equal to $4\tau$ minus the time for the rf pulses minus half the time for ramping up and down to the desired strength (see FIG. 12). For small field of views and/or small $\tau$, this requirement is the limiting factor given fixed system requirements. It should be noted, however, that this is still a much weaker requirement on the gradient hardware than that of EPI.

Figure 13:
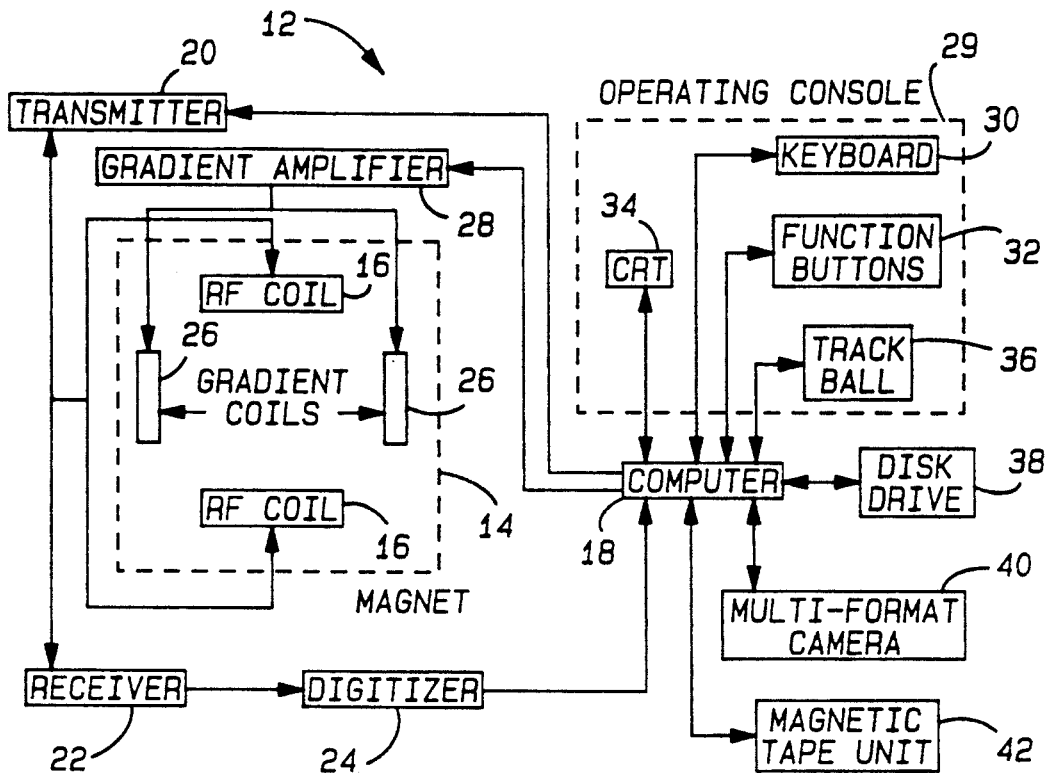
FIG. 13 is a functional hardware block diagram of a conventional MRI system.

The MET technique of the present invention is easily implemented using standard clinical MRI hardware such as that shown in FIG. 13. This MRI apparatus 12 includes a main magnet 14 for generating the static longitudinal magnetic field. RF coils 16 are used to generate the rf signal by means of a control signal from a computer 18 which cause the rf signal to be generated by a transmitter 20. The rf coils also are used to sense the received rf frequency spin-echoes, which are directed to a receiver 22 and digitized by a digitizer 24 before being transmitted to the computer 18. Gradient coils 26 generate magnetic field gradients $G_x$, $G_y$, and $G_z$ in the x, y, and z direction. These gradient coils receive currents produced by a gradient amplifier 28 which is controlled by the computer 18. An operating console 29 contains a keyboard 30 and function buttons 32 for entering parameters to permit the programming of the pulse sequence such as the one shown in FIG. 10.

An image produced by the NMR signal is displayed on a CRT 34 and a track ball 36 is used to highlight some areas on the image or to define specific slices through the image. A disk drive 38 stores sequences and image data. A multi-format camera 40 permits the exposing of multiple MRI images on a X-ray film. A magnetic tape unit 42 is used for long term storage of data off the disk drive 38.

Further Applications of Multiplexed Echo Trains

The general nature of multiplexed echoes allows the collection of two dimensions of information (inter-echo and intra-echo) in one data collection. In the preferred embodiment, emphasis has been on measuring information along two spatial dimensions. The general concept outlined above, however, would allow one to replace one or two of these spatial dimensions with a spectroscopic (chemical shift) dimension, temporal dimension (to measure events happening on a time scale greater than the time for one echo, but less than the entire observation period), or some physical dimension such as motion (incoherent or coherent).

Another important point to address concerning the flexibility of the MET method is the possibility for integration of this technique with existing techniques. While the foregoing has taught the collection of an entire data set in one observation period, it will be appreciated that one may desire to collect only part of a data set in each data collection period. This would allow finer sampling of a two-dimensional space, or sampling of a three-dimensional space in a faster time frame than otherwise possible. Additionally, one could repeat the observation period of the sequence of FIG. 10 multiple times in a contiguous fashion, separating each period with a refocussing 180 degree pulse (in effect fusing this technology with RARE type sequences (See J. Hennig et. al., Mag Res Med, 3(6) (1986)). Alternatively one could reverse the readout gradient at the end of each MET observation period in an EPI fashion. Either of these methods would allow a plurality of echo trains to be observed while the imprinted pattern was still present in the magnetization of the object. The interleaved refocussing 180° pulses would have the advantage of retaining the refocussed phase dispersion from chemical shift and main field inhomogeneity for each echo. Application of the phase encoded gradient between each of these observation periods would produce an appropriate path through k-space such that the entire k-space of the object would be effectively sampled.

The previous discussion has only referred to the application of the readout gradient during the precessional periods between rf pulses during spin preparation. One could, in general, apply any amount of any or all of the three orthogonal field gradients during the precessional periods. This would cause the echoes to be displaced in k-space in any fashion desired. The position of each echo in any axis k-space would be given by equation 2, where $A_j$ would correspond to the amount of precession due to the corresponding gradient (or natural precession, in the case of chemical shift and main field inhomogeneity). An example of where this would be useful is the application of phase-encoded gradient during the precessional periods, where the amount of applied phase-encoded gradients is proportional to the amount of applied readout gradient applied but scaled by some constant much less than 1. This would allow one to skew echoes in k-space slightly off the $k_x$-axis such that the k-space trajectory during the readout period along the $k_x$-axis (obtained in the pulse sequence of FIG. 10 by eliminating the application of the Gy during spin evolution and observation) would detect each of the multiplexed echoes at a different phase coherence along the y (phase-encoded) direction.

A more general approach to the notion of multiplexed echoes can be taken than that of the preferred embodiments. As stated prior to Equation 1, the choice of the multiplexing function f can be much more than the summation of cosines. In general, any set of complex exponential may be desired for different applications of the present invention. They need not be evenly spaced, nor do they need to be applied with a sequence similar to FIG. 7.

A Comparison of Multiplexed Echo Train (MET) and Echo Planar Methods for Single-Shot Imaging As a single-shot imaging technique, MET compares favorably to EPI in a number of different areas. The comparison here will be with standard EPI, which uses rapid gradient switching of the readout gradient to cover k-space rather than the variety of EPI methods which scan k-space in a spiral fashion.

Acquisition Speed and Hardware Requirements

The most notable aspect of both MET and EPI techniques is speed of data acquisition. If one ignores the restrictions of hardware, EPI will likely be slightly faster than MET. This is because they will share the same evolution and observation periods, and EPI has no preparation period as does MET. Data matrix size and sampling rate will affect both the speed of both methods equally. Given hardware limitations, however, EPI must sacrifice much more than MET in speed and/or field of view due to gradient hardware slew rate limitations. For most current clinical systems, hardware limitations make MET the only practical single-shot imaging technique.

Chemical Shift and $B_o$ Inhomogeneity Artifacts

In EPI, there is a pronounced spatial shift of fat from water in a reconstructed image due to the lack of chemical shift refocussing. This same phenomenon causes a geometric distortion of the image due to poor shimming of the main ($B_o$) magnetic field. The brain has virtually no fat, and body imaging can be preceded by fat suppression, so fat/water chemical shift artifacts can be minimized if they exist. MET has none of these problems due to its inherent refocussing of phase dispersion from chemical shift and field inhomogeneity for every phase-encoded echo.

Image Contrast

Both EPI and MET have similar relaxation weighting; that is, the 'infinite TR' of single-shot techniques eliminates T1 weighting of the signal, although a pre-inversion or pre-saturation pulse could be used if T1 weighting is desired. Both techniques typically have a higher T2 weighting due to the long time the magnetization is in the transverse plane. For both techniques, this T2 weighting, if severe (due to a observation period which is long with respect to T2) and not corrected for, will be expressed as some form of distortion in the reconstructed image.

Signal to Noise Ratio

Perhaps the least desirable feature of MET imaging is the SNR. Equation 3 illustrates that the power of a single echo must be distributed among all of the phase-encoded echoes. If the power is distributed equally among all of the echoes, the SNR of MET imaging is roughly bounded from above by the SNR of a conventional spin echo sequence with comparable parameters (same TR, TE, fov, etc.) divided by the square root of the phase encode resolution. Therefore the SNR of an image with resolution of 64 in the phase-encoded direction is at most roughly ⅛th that of a conventional sequence. Echo planar imaging does not redistribute power among many echoes, but rather reads the same echo multiple times-hence each phase encoded echo is roughly at maximum strength (ignoring relaxation). Only one of those echoes has refocussed phase dispersion from chemical shift and field inhomogeneity, however, so that there is a T2* attenuation of the outer echoes. Overall, EPI is likely to have better SNR than MET in most cases.

Effects of Motion

Another, perhaps less important obstacle to MET imaging is the high first moment of the readout gradient. This moment is not present in EPI techniques, in which the readout gradient oscillates about zero rather than accumulating a large time integrated area. The high first moment of MET imaging will have two effects. The first is a high diffusion weighting on the later echoes. The second is a motion-dependent phase addition to each phase-encoded echo. If there is constant velocity motion, this phase addition will be quadratic in time. The general effect of this motion-dependent phase accumulation is a ghosting in the phase-encoded direction. In cooperative patients, this seems not to be a problem in head imaging. In body imaging, although there is cardiac motion, there is also a reduced first moment due to the larger field of view used.

Three-Dimensional Imaging

Both techniques are capable of multi-slice and true (doubly phase-encoded), three-dimensional data collection. For MET imaging, multi-slice imaging will likely involve a single preparation (multiplexing) period (using non-selective rf pulses) followed by repeated slice selective evolution/observation periods. The T1 relaxation effects after multiplexing will likely limit the number of slices possible. Slice selective multiplexing performed before each evolution/observation period may be possible with higher quality hardware, and would allow a greater number of slices to be collected. In true three-dimensional imaging, dynamic range problems may dominate electronic noise in some cases of MRI; in these cases, MET imaging would be ideal, since the SNR would be less problematic. The duration of MET (and EPI) true three-dimensional data acquisition will be comparable to conventional two-dimensional acquisition times.

Empirical Examples of Multiplexed Echo Trains

Figure 14A:
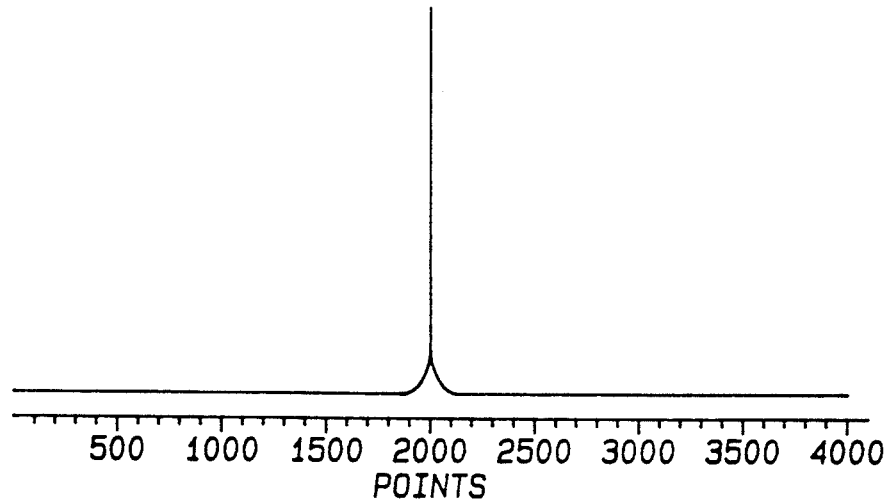
FIGS. 14A-D illustrate spin-echo data and spectral profile of the echo with and without multiplexing in accordance with the present invention.
Figure 14B:
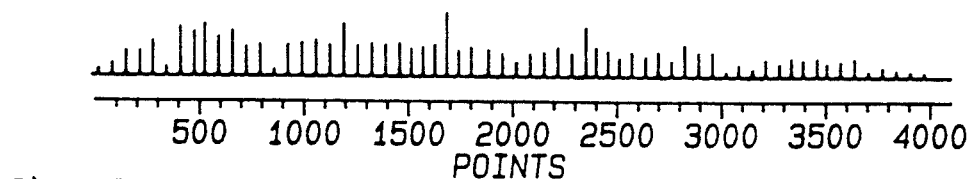
Figure 14C:
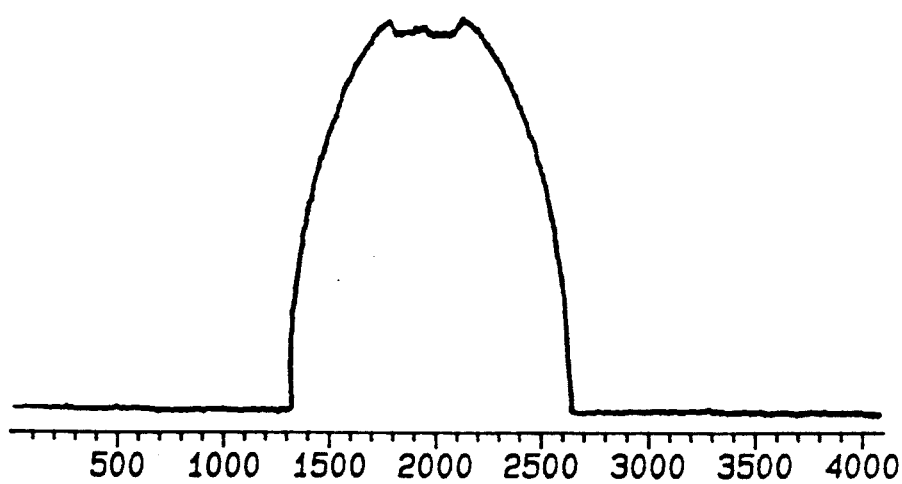
Figure 14D:
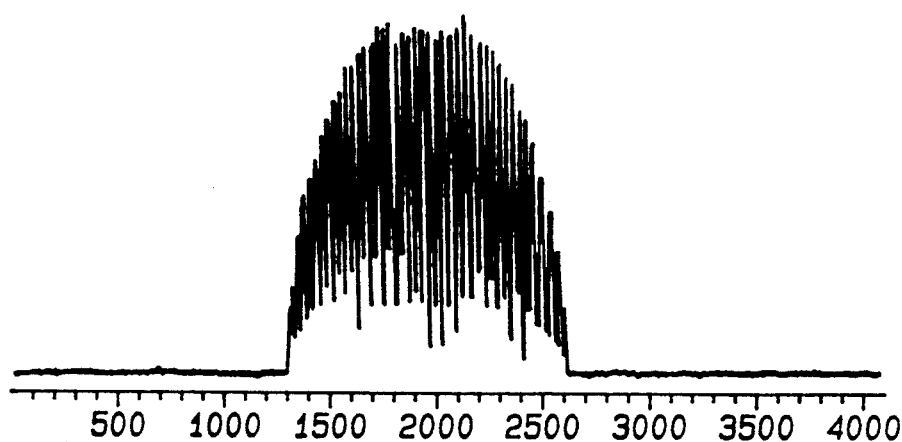
Figure 15:
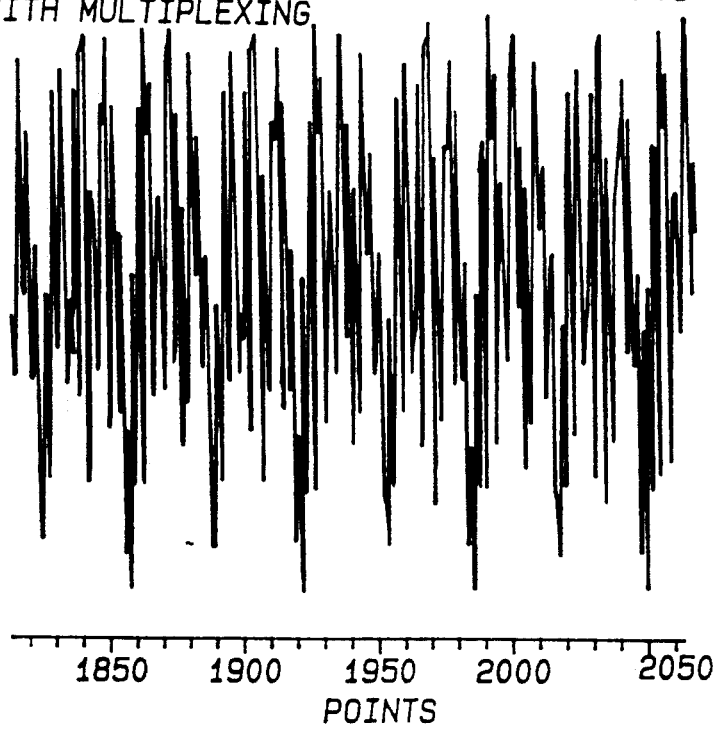
FIG. 15 is a graph of the spatial modulating function f produced through multiplexing in accordance with the present invention.

The data in FIGS. 14–16 were collected using a General Electric NMR Instruments 2.0-T CSI OMEGA equipped with Acustar S-180 gradients. The data in FIGS. 17A-B were collected on a General Electric SIGNA whole body clinical MR imager with standard shielded gradient hardware. The sequence parameters for all data sets shown in this section are included in Appendix II. In all cases, the rf pulses $\alpha_i$ were chosen to maximize $\Pi\, a_i$, where $a_i$ is the height of the i'th echo as in Equation 1, given a fixed set of gradient areas $A_j$. This optimization is designed to evenly spread the power among the echoes and maximize the power remaining in the longitudinal magnetization. The gradient areas $A_j$ were chosen with only some intuition about what was optimal, and there is very likely many gradient area sets which will prove to be better for many different applications.

FIGS. 14A-D show data collected from a phantom containing distilled water. FIGS. 14A and B show the magnitude of echoes from an identical evolution and observation period, but the data in 14B is preceded by a multiplexed preparation period. The corresponding Fourier Transforms (magnitude) are shown in FIGS. 14C and 14, respectively. The scaling factor for the plots in FIGS. 14A and 14B are the same, as is the scaling factor for the plots in FIGS. 14C and 14D. The multiplexing parameters (see FIG. 7) for FIGS. 14B and 14D are as follows:

| rf pulse angles (degrees) | 47 | −126 | −37 | 72 | −20 | −34 | 57 |
|---|---|---|---|---|---|---|---|
| relative gradient areas | 2 | 1 | 4 | 8 | 8 | 8 | |

One can see how the single echo of FIG. 14A is split into several (63 in this case) smaller amplitude echoes of FIG. 14B. This is a result of the spatial multiplication of the profile in FIG. 14C by a function f, resulting in the spatial profile seen in FIG. 14D. A closer look at this profile, seen in FIG. 15, shows that the function f is periodical and repeats every 64 points (here we see 256 points, four repetitions). The spatial period of this repetition is equal to the resolution element available with one of the echoes in FIG. 14B. This is, of course, the pixel size one would obtain were the 63 echoes phase encoded and parsed into a two-dimensional matrix for imaging. Referring back to FIGS. 14C and 14D, note that the power lost due to signal remaining in the transverse plane after the preparation period is expressed as that portion of the profile lost due to multiplexing.

Figure 16B:
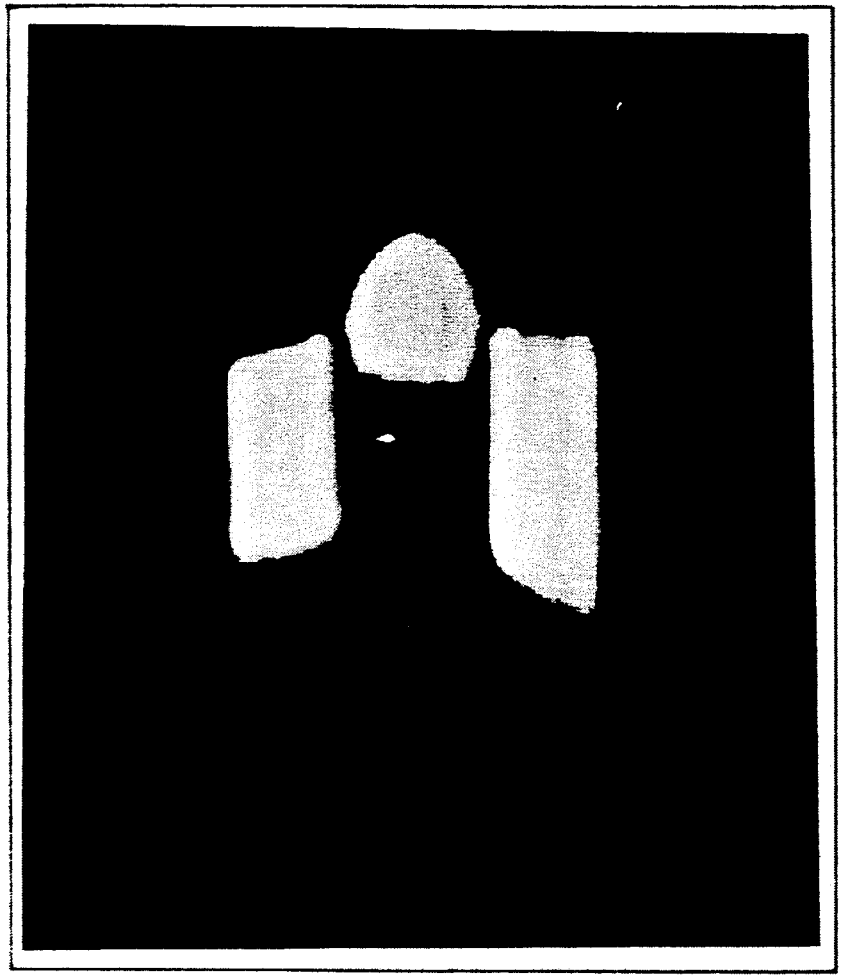
FIGS. 16A-C are images of chemical shift phantom for spin echo, EPI, and multiplexed echo trains, respectively.
Figure 16A:
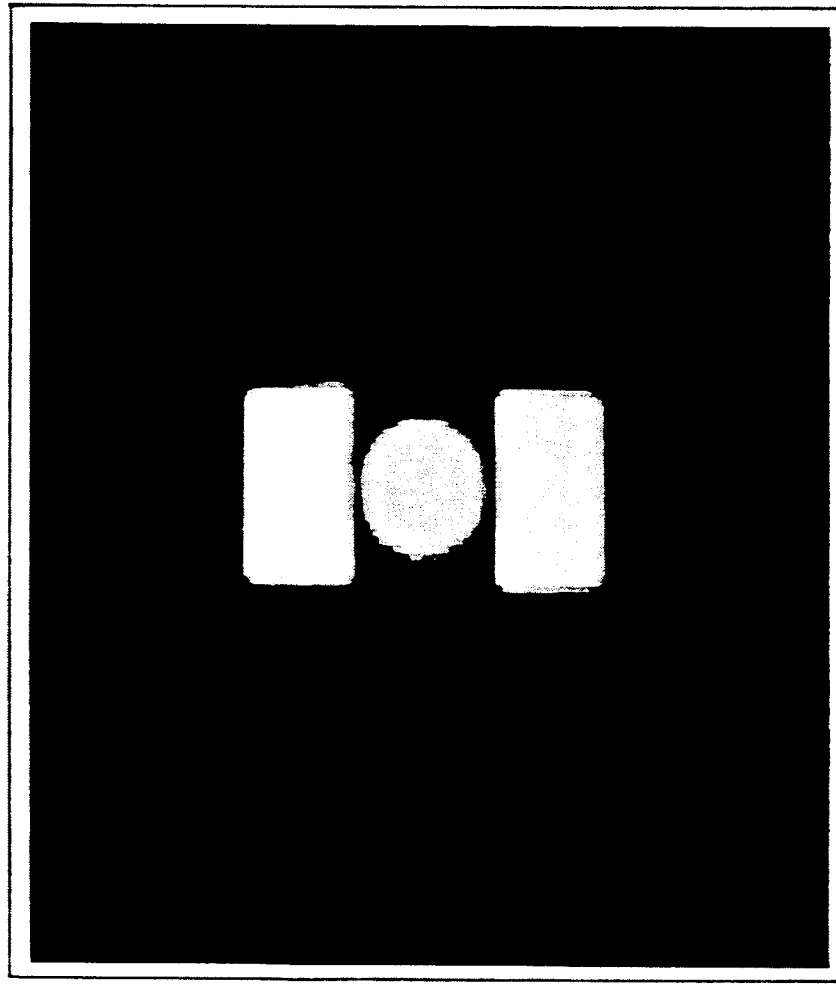
Figure 16C:
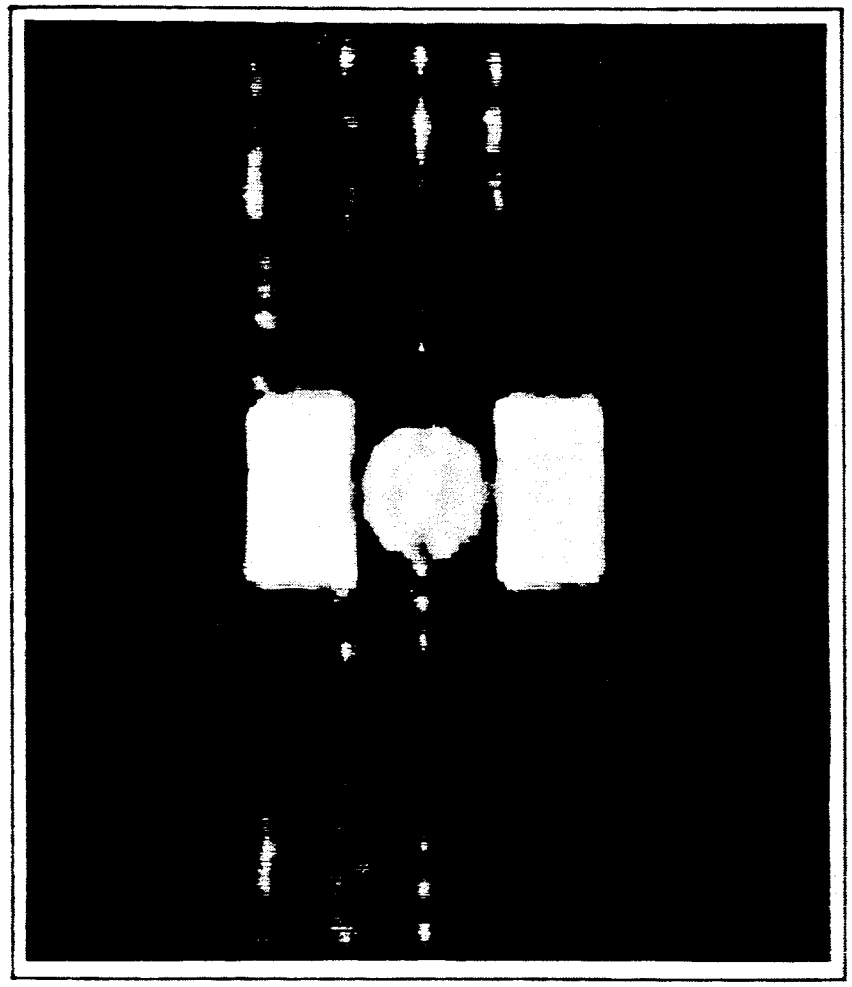

FIGS. 16A–C show three images of a phantom made of distilled water (the two outer, rectangular shapes) and acetone (the inner, round shape). FIG. 16A is a conventional spin echo technique with separate data acquisitions of each phase encoding line. FIG. 16B is a single-shot EPI image, and FIG. 16C is a single-shot MET image. The multiplexing parameters in FIG. 16C are the same as those for FIG. 15. The NMR signal from acetone has a chemical shift of 2.5 p.p.m. with respect to water. This difference in EPI images is an apparent spatial displacement of the acetone with respect to the water by a distance d equal to $$d = \frac{(c.s.)(\omega_0)(fov)(xres)}{\omega_s}, \quad [4]$$

where c.s. is the chemical shift, $\omega_0$ is the NMR frequency, fov is the field of view, xres is the resolution in the readout direction, and $\omega_s$ is the data sampling frequency. Although this artifact is also due in part to susceptibility differences between acetone and water, this phenomena can be included in the chemical shift for the purpose of this discussion. Also apparent in FIG. 16B is the spatial distortion of the two rectangular bottles as compared to FIG. 16A due to the effects of an inhomogeneous magnetic field. Note the lack of both chemical shift artifacts and spatial distortion in the MET image of FIG. 16C.

An illustration of in vivo MET images is shown in FIGS. 17A–B. FIG. 17A shows an axial image through the head reconstructed from data collected with a standard spin echo sequence. FIG. 17B shows an image of the same anatomical slice reconstructed from data using the MET technique. The multiplexing parameters (see FIG. 7) for FIG. 17B are as follows:

| rf pulse angles (degrees) | −35 | 42 | 13 | −49 | −79 | −107 | 52 |
|---|---|---|---|---|---|---|---|
| relative gradient areas | 6 | 6 | 7 | 5 | 4 | 7 | |

This sequence produces 65 echoes, 63 contiguous echoes which are observed during readout and 2 echoes which are not used. Both data sets have the same resolution (64×64), field of view (30 cm), slice thickness (1 cm), and number of averages (1).

Pulse Design Strategies for Multiplex Echo Train Single-Shot Imaging

Pulse Sequence design for MET imaging is facilitated by developing an intuitive feel for what is happening, and by conceptualizing gradient areas and echo placement in a numeric/graphical fashion. The following points are useful for developing multiplexing design strategies. Unless otherwise stated, it is always assumed that one is designing the sequence to be free from chemical shift artifact in the phase encoded direction.

In a straightforward implementation of MET, the total area of the gradients (the sum of all $A_j$ of Equation 2) during the multiplexing (preparation) part of the sequence specifies the distance in $k_x$ space that the outermost echoes during readout will appear. If n echoes are to be observed, and the gradient area necessary to read out each echo is S, then the total area of the mixing gradients must be (S n/2). In order for the echoes to appear contiguously during readout, there must be combinations of $b_i$ of Equation 2 from 0 to n/2. The most parsimonious set of gradients areas $A_j$ are $\{1,3,9,27, \ldots\}$. With this set, one can obtain the most contiguous echoes with the least number of rf: gradient pairs, because of the lack of redundant $b_i$'s. This does not reduce the total multiplexing time, however, which is set by the number of echoes and the observation time for each individual echo. In addition, the small number of rf pulses used by this set of gradient areas gives the user less degrees of freedom in determining the values of $a_i$ of Equation 1.

In general, the requirements for the smallest gradient area of the set of $\{A_j\}$ are the most stringent, since the time required to leave the gradients off for the rf pulses is proportionately the greatest, requiring stronger gradients and/or faster ramping times to make up for the lost time. One way to overcome this is to eliminate the smaller gradient sets. The down side to this method is that there is no way to place all echoes contiguously if the gradient with a relative area $A_j=1$ (the smallest gradient area) is not included. With wise choice of $A_j$, however, one can place all but a single pair of echoes in a contiguous fashion. For instance, the gradient set $\{5,6,7,8,9\}$ will have echoes at $+/-35$, $+/-30$, $+/-29$, $+/-28$, $+/-27$, ..., $+/-1$, and 0 in k-space. The echoes at $+/-35$ can be ignored during readout, and there will be 61 contiguous echoes for data collection. Thus only 2 of 63 echoes are discarded, and the smallest gradient area is 5.

On the other side of system hardware performance, if the gradient area of $A_j=1$ can be applied in the appropriate time frame, then one can replace the gradient waveform shown in FIG. 7 with a long string of gradient pulses of area 1. Rf pulses can then be appropriately placed at varying intervals during this string to allow for different gradient areas $A_j$. Thus to achieve $A_j=5$, one merely waits for 5 applications of the gradient with area 1 between rf pulses. The benefit of the method of gradient application is that one can achieve a 'steady state' in which the true gradient area, including amplifier response times and eddy currents, is the same for each unit gradient pulse. All gradient areas $A_j$ will then truly be integer multiples of some common denominator, and only one amplitude adjustment factor will be needed for the multiplexing gradients.

From the foregoing it can be seen that the present invention provides a NMR technique which multiplexes the information of the NMR signal. In a preferred embodiment, the multiplexed echo trains are used to provide a single-shot MRI technique which avoids the constant reversal of the readout gradient of EPI. The present invention avoids chemical shift artifacts as well as artifacts due to magnetic field inhomogeneity which can degrade MRI images. Unlike EPI, the techniques of the present invention can be implemented on conventional MRI equipment. It will also be appreciated that the technique of the present invention for producing multiplexed NMR echo trains has other uses besides those in the field of MRI. Those skilled in the art can appreciate that other advantages can be obtained from the use of this invention and that modification may be made without departing from the true spirit of the invention after studying the specification, drawings and following claims.

APPENDIX I

This discussion will show the effect on the NMR signal if one interrupts a constant precession in the transverse plane with periodic rf pulses all applied at the same phase. A right-handed Cartesian coordinate system will be used, and rotations due both the rotating H1 and static (H0) field will, by convention, rotate spins via the right-hand rule. All calculations will be done in a rotating frame of reference with coordinates x, y and z. The static field is oriented along the +z direction, and the rf is always applied along +x.

Before any rf is applied, assume that the system is in equilibrium with the static field. Then the net normalized NMR magnetization vector can be represented by

| Mx | My | Mz | [1.1] |
|----|----|----|----|
| 0  | 0  | 1  |    |

After application of the first rf pulse, the spin are rotated about x by $\alpha_0$ degrees. The magnetization vectors are now:

| Mx | My | Mz | [1.2] |
|----|----|----|----|
| 0  | $-\text{Sin}(\alpha_0)$ | $\text{Cos}(\alpha_0)$ |   |

After the rf pulse, there is a period in which the vectors precess in the transverse plane. In the first precession period, the spins accumulated a phase $p_1$. The magnetization vectors are now:

| Mx | My | Mz | [1.3] |
|----|----|----|----|
| $\text{Sin}(\alpha_0)\text{SIN}(p_1)$ | $-\text{Cos}(\alpha_0)\text{COS}(p_1)$ | $\text{Cos}(\alpha_0)$ |   |

A second rf pulse $\alpha_1$ mixes the My and Mz magnetization to produce:

| Mx | My | Mz | [1.4] |
|----|----|----|----|
| $\text{Sin}(\alpha_0)\text{SIN}(p_1)$ | $-\text{Cos}(\alpha_0)\text{Sin}(\alpha_0)\text{COS}(p_1) - \text{Sin}(\alpha_1)\text{COS}(\alpha_0)$ | $\text{Cos}(\alpha_1)\text{COS}(d_0) - \text{Sin}(\alpha_1)\text{Sin}(\alpha_0)\text{COS}(p_1)$ |   |

Note here that the Nx term is composed only of $\text{Sin}(p_i)$ terms, and the My and Mz terms are composed only of $\text{Cos}(p_i)$ terms (the DC term can be considered $\text{Cos}(0)$). At this point consider what happens in general to a magnetization vector when it precesses a phase $p_j$ and then is tipped by an rf pulse $\alpha_i$. A general vector is given as $$\begin{array}{ccc} Mx & My & Mz \\ A & B & C \end{array} \quad [1.5]$$

After processing $p_i$, the vector becomes:

$$\begin{array}{ccc} Mx & My & Mz \\ A\cos(p_i) & A\sin(p_i) & \\ -B\sin(p_i) & +B\cos(p_i) & C \end{array} \quad [1.6]$$

After the rf pulse $\alpha_i$, the vector is:

$$\begin{array}{ccc} Mx & MY & Mz \\ A\cos(p_i) & A\cos(\alpha_i)\sin(p_i) & A\sin(\alpha_i)\sin(p_i) \\ -B\sin(p_i) & +B\cos(\alpha_i)\cos(p_i) & +B\sin(\alpha_i)\cos(p_i) \\ & -C\sin(\alpha_i) & +C\cos(\alpha_i) \end{array} \quad [1.7]$$

Now, IF the condition is true that $$A = \sum_j a_{Aj}\text{SIN}(p_{Aj}), \quad [1.8a]$$

$$B = \sum_j a_{Bj}\text{COS}(p_{Bj}), \quad [1.8b]$$

$$C = \sum_j a_{Cj}\text{COS}(p_{Cj}), \quad [1.8c]$$

Then, combining [1.7] and [1.8], the vector components after the precession:rf combination are:

$$Mx = \left[\sum_j a_{Aj}\text{SIN}(p_{Aj})\right]\cos(p_i) - \quad [1.9a]$$

$$\left[\sum_j a_{Bj}\text{COS}(p_{Bj})\right]\text{SIN}(p_i) =$$

$$\tfrac{1}{2}\sum_j a_{Aj}[\text{SIN}(p_{Aj} - p_i) - \text{SIN}(p_{Aj} + p_i)] -$$

$$\tfrac{1}{2}\sum_j a_{Bj}[\text{SIN}(p_i - p_{Bj}) - \text{SIN}(p_i + p_{Bj})]$$

$$My = \left[\sum_j a_{Aj}\text{SIN}(p_{Aj})\right]\cos(\alpha_i)\sin(p_i) + \quad [1.9b]$$

$$\left[\sum_j a_{Bj}\text{COS}(p_{Bj})\right]\cos(\alpha_i)\cos(p_i) -$$

$$\left[\sum_j a_{Cj}\text{COS}(p_{Cj})\right]\sin(\alpha_i) =$$

$$\frac{\cos(\alpha_i)}{2}\sum_j a_{Aj}[\cos(p_{Aj} - p_i) - \cos(p_{Aj} + p_i)] +$$

$$\frac{\cos(\alpha_i)}{2}\sum_j a_{Bj}[\cos(p_{Bj} - p_i) + \cos(p_{Bj} + p_i)] -$$

$$\frac{\sin(\alpha_i)}{2}\sum_j a_{Cj}[\cos(p_{Cj})]$$

$$Mz = \left[\sum_j a_{Aj}\text{SIN}(p_{Aj})\right]\sin(\alpha_i)\sin(p_i) + \quad [1.9c]$$

$$\left[\sum_j a_{Bj}\text{COS}(p_{Bj})\right]\sin(\alpha_i)\cos(p_i) +$$

$$\left[\sum_j a_{Cj}\text{COS}(p_{Cj})\right]\cos(\alpha_i) =$$

$$\frac{\sin(\alpha_i)}{2}\sum_j a_{Aj}[\cos(p_{Aj} - p_i) - \cos(p_{Aj} + p_i)] +$$

$$\frac{\sin(\alpha_i)}{2}\sum_j a_{Bj}[\cos(p_{Bj} - p_i) + \cos(p_{Bj} + p_i)] =$$

$$\frac{\cos(\alpha_i)}{2}\sum_j a_{Cj}[\cos(p_{Cj})]$$

There are two important things to note from [1.9]. First, given condition [1.8] is true before the precession:rf period, then [1.8] is true afterwards as well. Restated, the precession:rf combination maintains a vector in which Mx is composed of the sum of sines of various sums of the precessional phases $p_i$ while My and Mz are the sum of cosines of various sums of the precessional phases $p_i$. Now, if we start from the magnetization state [1.1], we arrive at the condition [1.4], which satisfies [1.8]. Note that so far, the cause of the precession between rf intervals has not been specified. In general, it is assumed that the phase accumulation $p_i$ is due to a constant frequency from the rf frequency $\omega$ over the time $t_i$. Stated mathematically, $$P_i = \omega t_i.$$

In addition, there is likely to be a temporally constant range of $\omega$'s (i.e. a spectrum) over the region of interest. Although it has not been explicitly stated, Mz of [1.1] is actually a function of $\omega$, since there will be different amounts of signal from different parts of the spectrum (whether the spectrum be from an applied gradient field, chemical shift, etc.). Thus the equation of [1.9.c] is multiplied by the factor Mz($\omega$). If, after the last precession:rf period, we crush the transverse magnetization, we see that [1.9.c] is the function f of [1] in the general discussion that is multiplied times the spectrum Mz($\omega$). If this is the case, then in the Fourier transform of $\omega$ (which is time), the transform of the spectrum (i.e. the echo) is convolved with the Fourier transform of [1.9.c], which is a variety of even symmetric delta functions at positions $b_i$.

Notice that in [1.9.c], the cosine arguments from the previous iteration are summed with $\{-1,0,1\}*p_i$. In particular, the last two terms of both [1.9b.] and [1.9.c] guarantee the condition [2] in the general text, which says that the final arguments for the cosine terms are of the general form $$b_i = \sum_{j=1}^{J} d_{ij} p_j,$$

$$d_{ij} \in \{-1, 0, 1\}.$$

Note this proof has been for any general spectra, and has assumed constant $\omega$. In the case of a gradient which is turning off and on during the preparation period, the ω is not constant. This is of no consequence if the area of the gradient is sufficient so that each precession $p_i$ is the same as if the gradient had been constant.

APPENDIX II
Pulse Sequence Parameters for Data of FIGS. 14–17

| Parameters | FIG. 14A, C (Convent.) | FIG. 14B, D (MET) | FIG. 15 (MET) | FIG. 16A (Convent.) | FIG. 16B (EPI) | FIG. 16C (MET) | FIG. 17A (Conven.) | FIG. 17B (MET) |
|---|---|---|---|---|---|---|---|---|
| Resolution | 4096 | 4096 | 4096 | 64 × 64 | 64 × 64 | 64 × 64 | 64 × 64 | 64 × 64 |
| Number of averages | 1 | 1 | 1 | 1 | 1 | 1 | 1 | 1 |
| Sampling rate | 100 kHz | 100 kHz | 100 kHz | 60 kHz | 80 kHz | 60 kHz | 16 kHz | 62.5 kHz |
| Field of view | 20 cm | 20 cm | 20 cm | 20 cm | 20 cm | 20 cm | 30 cm | 30 cm |
| Slice thickness | 1 cm | 1 cm | 1 cm | 1 cm | 1 cm | 1 cm | 1 cm | 1 cm |
| Echo Time (TE) | — | — | — | 50 ms | — | — | 70 ms | — |
| Repetition Time | — | — | — | 4 sec. | — | — | 4 sec. | — |

We claim:

1. A method for generating nuclear magnetic resonance signals from an object, the method comprising the steps of:
   imprinting a repetitive pattern on a longitudinal magnetization of the object, said pattern being composed of a sum of complex exponentials, wherein a train of spin-echoes is generated during a spin preparation stage;
   allowing said spins to precess in an evolution stage; and
   sensing said train of echoes generated by said spins in an uninterrupted readout period during an observation stage.

2. The method of claim 1 wherein the object has a known frequency profile and wherein said step of imprinting is performed by applying a sequence of rf pulses to said nuclei, said pulses being separated by different periods of spin precession, said periods being proportional to a width of said known frequency profile of the object, wherein said longitudinal magnetization is multiplied by a function composed of a sum of weighted cosine functions.

3. The method of claim 2 wherein said rf pulses have varying amplitudes.

4. The method of claim 2 wherein said rf pulses have varying durations.

5. The method of claim 2 further comprising the step of applying a constant magnetic field gradient throughout said sequence of rf pulses, wherein echoes due to field gradient refocussing temporally coincide with echoes due to refocussing of sources of spectral content other than said rf pulse sequence, whereby geometric distortion due to the propagation of information from said other sources is substantially eliminated.

6. The method of claim 5 further comprising the step of interrupting said applied constant magnetic gradient during the time that each of said rf pulses are being applied, wherein the time integrated area of the applied field gradient does not change between rf pulses, whereby a more uniform tip angle of the magnetization due to each rf pulse is achieved.

7. The method of claim 1 wherein said step of evolving said train of echoes further comprises the steps of:
   rotating the longitudinal magnetization of said nuclei into the transverse plan by applying a 90° rf pulse, wherein one-half of said echo train can be detected; and
   refocusing the longitudinal magnetization of said nuclei into the transverse plane by applying a 180° pulse, thereby reversing the precession of said nuclei, whereby the entire train of echoes can be detected.

8. The method of claim 7 further comprising the step of applying a longitudinal magnetic gradient during the application of said rf pulse in said steps of evolving and observing which selectively limits the train of echoes to a two-dimensional plane.

9. The method of claim 1 further comprising the step of repeating said observation stage by interleaving said observation stage with refocussing 180° rf pulses wherein a plurality of echo trains can be produced and detected.

10. The method of claim 1 further comprising the step of repeating the observation stage by alternating the sign of the readout gradient between said repeated observation stages, wherein a plurality of echo trains can be produced and detected.

11. The method of claim 2 further comprising the step of dividing said observed train of echoes into a two-dimensional matrix of two orthogonal pieces of information, comprising information within each echo and information between each echo.

12. The method of claim 2 further comprising the step of introducing a small amount of phase encoded field gradient orthogonal to the readout gradient between each echo with a slightly different phase coherence in that direction, whereby $k_x$-space and $k_y$-space are both effectively sampled.

13. The method of claim 1 further comprising the step of inserting each echo into a separate row of a two-dimensional imaging matrix after said observation stage to generate an MRI image.

14. The method of claim 1 further comprising the step of weighting each phase encoded echo by a constant factor and normalizing out said weighting before an image is generated.

15. The method of claim 2 further comprising the step of applying a field gradient between said rf pulses wherein the alignment of the echo train in k-space is placed in a predetermined position.

16. The method of claim 15 wherein said step of applying a field gradient has the result that the train of echoes do not all lie along the $k_x$ axis, whereby each echo will contain appropriate phase encoding along the $k_y$ axis.

17. A method for generating magnetic resonance imaging (MRI) signals from an object, the method comprising the steps of:
   imprinting a repetitive pattern on a longitudinal magnetization of the object by applying a sequence of rf pulses, said pattern being composed of a sum of complex exponentials wherein a train of spin-echoes is generated during a spin preparation stage;
   allowing said spins to precess in an evolution stage;

sensing said train of echoes generated by said spins in an uninterrupted readout period during an observation stage; and inserting each sensed echo into a separate row of a two-dimensional imaging matrix to generate an MRI image.

18. The method of claim 17 wherein the object has a known frequency profile and wherein said step of imprinting is performed by applying a sequence of rf pulses to said nuclei, said pulses being separated by different periods of spin precession, said periods being proportional to the width of said known frequency profile of the object, wherein the longitudinal magnetization is multiplied by a function composed of a sum of weighted cosine functions.

19. The method of claim 18 wherein said rf pulses have varying amplitudes.

20. The method of claim 18 wherein said rf pulses have varying durations.

21. The method of claim 18 further comprising the step of applying a constant magnetic field gradient throughout said sequence of rf pulses, wherein echoes due to field gradient refocussing temporally coincide with echoes due to refocussing of sources of spectral content other than said rf pulse sequence, whereby geometric distortion due to the propagation of information from said other sources is substantially eliminated.

22. The method of claim 21 further comprising the step of interrupting said applied constant magnetic gradient during the time that each of said rf pulses are being applied, wherein the time integrated area of the applied field gradient does not change between rf pulses, whereby a more uniform tip angle of the magnetization due to each rf pulse is achieved.

23. The method of claim 17 wherein said step of evolving said train of echoes further comprises the steps of:

rotating the longitudinal magnetization of said nuclei into the transverse plan by applying a 90° rf pulse, wherein one-half of said echo train can be detected; and refocusing the longitudinal magnetization of said nuclei into the transverse plane by applying a 180° pulse, thereby reversing the precession of said nuclei, whereby the entire train of echoes can be detected.

24. The method of claim 23 further comprising the step of applying a longitudinal magnetic gradient during application of said rf pulse in said steps of evolving and observing which selectively limits the train of echoes to a two-dimensional plane.

25. The method of claim 17 further comprising the step of repeating said observation stage by interleaving the observation stage with refocussing 180° rf pulses wherein a plurality of echo trains can be produced and detected.

26. The method of claim 17 further comprising the step of repeating the observation stage by alternating the sign of the readout gradient between said repeated observation stages wherein a plurality of echo trains can be produced and detected.

27. The method of claim 17 further comprising the step of dividing said observed train of echoes into a two-dimensional matrix of two orthogonal pieces of information, comprising information within each echo and information between each echo.

28. The method of claim 17 further comprising the step of introducing a small amount of phase encoded field gradient orthogonal to the readout gradient between each echo with a slightly different phase coherence in that direction, whereby $k_x$-space and $k_y$-space are both effectively sampled.

29. The method of claim 17 further comprising the step of weighting each phase encoded echo by a constant factor and normalizing out said weighting before an image is generated.

30. The method of claim 18 further comprising the step of applying a field gradient between said rf pulses wherein the alignment of the echo train in k-space is placed in a predetermined position.

31. The method of claim 30 wherein said step of applying a field gradient has the result that said train of echoes do not all lie along the $k_x$-axis, whereby each echo will contain appropriate phase encoding along the $k_y$-axis.

32. A system for generating nuclear magnetic resonance signals from an object, the system comprising:

means for imprinting a repetitive pattern on a longitudinal magnetization of a train of spin-echoes, said pattern being composed of a sum of complex exponentials, wherein said train of spin-echoes is generated during a spin preparation stage;

means for allowing said spins to precess in an evolution stage; and means for sensing said train of echoes generated by said spins in an uninterrupted readout period during an observation stage.

33. The system of claim 32 wherein said object has a known frequency profile and wherein said means for imprinting includes means for applying a sequence of rf pulses to said nuclei, the pulses being separated by different periods of spin precession, said periods being proportional to a width of said known frequency profile of said object, wherein said longitudinal magnetization is multiplied by a function composed of a sum of weighted cosine functions.

34. The system of claim 33 wherein said rf pulses have varying amplitudes.

35. The system of claim 33 wherein said rf pulses have varying durations.

36. The system of claim 33 further comprising means for applying a constant magnetic field gradient throughout said sequence of rf pulses, wherein echoes due to field gradient refocussing temporally coincide with echoes due to refocussing of sources of spectral content other than said rf pulse sequence, whereby geometric distortion due to the propagation of information from said other sources is substantially eliminated.

37. The system of claim 36 further comprising means for interrupting said applied constant magnetic gradient during the time that each of said rf pulses are being applied, wherein the time integrated area of the applied field gradient does not change between rf pulses, whereby a more uniform tip angle of the magnetization due to each rf pulse is achieved.

38. The system of claim 32 wherein said means for evolving said train of echoes further comprises:

means for rotating the longitudinal magnetization of said nuclei into the transverse plan by applying a 90° rf pulse, wherein one-half of said echo train can be detected; and means for refocusing the longitudinal magnetization of said nuclei into the transverse plane by applying a 180° pulse, thereby reversing the precession of said nuclei, whereby the entire train of echoes can be detected.

39. The system of claim 38 further comprising means for applying a longitudinal magnetic gradient during the application of said rf pulse which selectively limits the train of echoes to a two-dimensional plane.

40. The system of claim 32 further comprising means for repeating said observation stage by interleaving the observation stage with refocussing 180° rf pulses wherein a plurality of echo trains can be produced and detected.

41. The system of claim 32 further comprising means for repeating the observation stage by alternating the sign of the readout gradient between said repeated observation stages wherein a plurality of echo trains can be produced and detected.

42. The system of claim 33 further comprising means for dividing said observed train of echoes into a two-dimensional matrix of two orthogonal pieces of information, comprising information within each echo and information between each echo.

43. The system of claim 33 further comprising means for introducing a small amount of phase encoded field gradient orthogonal to the readout gradient between each echo with a slightly different phase coherence in that direction, whereby $k_x$-space and $k_y$-space are both effectively sampled.

44. The system of claim 32 further comprising means for inserting each echo into a separate row of a two-dimensional imaging matrix after said observation stage to generate an MRI image.

45. The system of claim 32 further comprising means for weighting each phase encoded echo by a constant factor and normalizing out said weighting before an image is generated.

46. The system of claim 33 further comprising means for applying a field gradient between said rf pulses wherein the alignment of said echo train in k-space is placed in a predetermined position.

47. The method of claim 46 wherein said means for applying a field gradient arranges said gradient and operates with the result that said train of echoes do not all lie along the $k_x$-axis, whereby each echo will contain appropriate phase encoding along the $k_y$-axis.

* * * * *